(12) United States Patent
Mirow

(10) Patent No.: US 7,456,700 B2
(45) Date of Patent: Nov. 25, 2008

(54) VARIABLE LOOP GAIN OSCILLATOR SYSTEM

(76) Inventor: Fred Mirow, 118 Cornell Rd., Bala Cynwyd, PA (US) 19004

( * ) Notice: Subject to any disclaimer, the term of this patent is extended or adjusted under 35 U.S.C. 154(b) by 113 days.

(21) Appl. No.: 11/786,714

(22) Filed: Apr. 12, 2007

(65) Prior Publication Data

US 2007/0252656 A1 Nov. 1, 2007

Related U.S. Application Data

(60) Provisional application No. 60/904,956, filed on Mar. 5, 2007, provisional application No. 60/874,558, filed on Dec. 13, 2006, provisional application No. 60/874,163, filed on Dec. 11, 2006, provisional application No. 60/873,398, filed on Dec. 7, 2006, provisional application No. 60/792,437, filed on Apr. 17, 2006.

(51) Int. Cl.
*H03L 1/00* (2006.01)

(52) U.S. Cl. .................................... 331/176; 331/175

(58) Field of Classification Search ............... 331/175, 331/176
See application file for complete search history.

(56) References Cited

U.S. PATENT DOCUMENTS

| 5,251,627 | A | * | 10/1993 | Morris | .............. 600/398 |
| 5,872,536 | A | * | 2/1999 | Lyons et al. | .............. 342/70 |
| 6,384,596 | B1 | * | 5/2002 | Beyer | .............. 324/207.16 |

* cited by examiner

*Primary Examiner*—Don P Le

(57) ABSTRACT

A system for comparing, measuring, or providing a reference signal based on a oscillator having variable loop gain is described. Only when the oscillator loop gain is at least the value of one does the oscillator produce an AC output signal. The oscillator's ability to oscillate is controlled by the one or more sensor/transducer input signal levels. In some cases, negative feedback of the AC output signal is also used to control the loop gain of the oscillator circuit keeping the loop gain at or close to the value of one. The system's output signal indicates whether the oscillator is oscillating or not, or the AC signal level required to just maintain oscillation.

10 Claims, 19 Drawing Sheets

VARIABLE LOOP GAIN OSCILLATOR SYSTEM

CROSS-REFERENCE TO RELATED APPLICATIONS

The benefits of filing this invention as the following listed Provisional application for patents by Fred Mirow are claimed;
"COMPARATOR MEASURING SYSTEM AND A/D USING LOOP GAIN SENSING", U.S. PTO 60/904,956 Filed Mar. 5, 2007,
"VOLTAGE REFERENCE SYSTEM USING CONSTANT LOOP GAIN", U.S. PTO 60/874,163 filed Dec. 11, 2006,
"SENSOR MEASURING SYSTEM WITH CONSTANT LOOP GAIN", U.S. PTO 60/873,398 filed Dec. 7, 2006,
"SENSOR MEASURING SYSTEM WITH CONSTANT LOOP GAIN", U.S. PTO 60/874,558 filed Dec. 13, 2006, and
"SENSOR MEASURING SYSTEM USING SENSOR TO DETERMINE LOOP GAIN", U.S. PTO 60/792,437 filed Apr. 17, 2006.

BACKGROUND OF THE INVENTION

This invention relates to systems for comparing, measuring or providing a reference signal based on variable oscillator loop gain and is described. Only when the oscillator loop gain is at least one does the oscillator produces an AC signal. The oscillator ability to oscillate is controlled by the one or more sensor or transducer input signal levels. Also in some cases negative feedback of the oscillator's AC signal is used to control the loop gain of the oscillator circuit, keeping the loop gain close to or at the value of one. The system's output signal depends on whether the oscillator is oscillating or not, or the oscillator's AC signal level required to just maintain oscillation.

Transducers and sensors have often been used to provide the input signals for many forms of prior art transducer instrumentation, for example, scales or balances, accelerometers, and pressure transducers or proximity gauges. In such systems, the precision at which measurements can be made is very much a function of the stability of the circuit interfacing the sensor portion and read-out-portion of the system. In general, the prior art systems have permitted relatively low precision measurements due to the sensitivity of the interface circuit to combinations of various factors such as drive signal waveshape, drive signal amplitude, drive signal frequency, and temperature dependent component parameter variation.

More particularly, the class of system exemplified by U.S. Pat. No. 3,318,153 to Lode includes circuit interface which generates an output signal as derived from a rectification and summing of current signals whose amplitude is dependent on both the magnitude and frequency of an applied drive signal, thereby requiring a high voltage drive signal at relatively low frequencies and establishing a relatively large power requirement. Thus, that system has a relatively high sensitivity to both drive signal amplitude and frequency, and, as a result, means is provided by Lode to maintain the amplitude-frequency product for the drive signal to be constant.

An other application of this invention is as a signal reference system. Stable references are required for circuits such as A/D converters, measurement devices, and voltage regulators to name only a few.

A buried-Zener reference is one way to produce a reference voltage. Another way to produce a reference voltage is with a bandgap voltage circuit. Bandgap voltage circuits can operate with a lower supply voltage than buried-Zener references and can also require less power. Operation of a bandgap voltage reference is well-known and produces a reference voltage that corresponds to the bandgap voltage of the used substrate material. In the most common case of silicon, this bandgap voltage is approximately 1.2 volt. The conventional bandgap reference circuits can therefore not be used for generating the necessary reference voltage in systems with supply voltages of 1.5 volt and below.

An objective of the present invention is to provide a system for comparing, measuring or providing a reference signal that has a high temperature, radiation, and voltage stability due to its reliance on passive component ratios to set circuit thresholds operating values. Passive components such as resistors and capacitors are more stable under these conditions. This invention increases system accuracy by making the accuracy dependent on passive component ratios instead of transistor or signal frequency stability.

An other objective of the present invention to provide a system for providing an output signal level dependant on the impedance or gain associated with a transducer or sensor using a system being relatively independent of the system signal amplitude, frequency, and waveshape. Additionally the system is relatively simple and inexpensive to implement.

An other objective of the invention is to provide a reference voltage or current which is insensitive to temperature and to variations in the main power supply and yet can produce a voltage at less than the bandgap voltage.

A further objective of the invention to provide circuits that are less susceptible to process variances by relying on impedance ratios thereby providing a more consistently manufacturable circuit.

BRIEF SUMMARY OF THE INVENTION

According to this invention, one or more transducers, this term also includes sensors, having a variable impedance or gain indicative of a physical or electrical parameter of interest, such as voltage, current, displacement, vibration, spacing, size, pressure and the like, are used along with other elements to form a oscillator.

A oscillator consist of a feedback network section combined with an amplifier section. The feedback network is connected to the input and output of the amplifier so as to provide positive feedback and be capable of oscillating. The amplifier has a phase shift of about 0 degrees, the feedback network supplies the remaining phase shift necessary to make the total phase shift at the frequency of oscillation 0 degrees. If the amplifier is phase inverting having a phase shift of about −180 degrees, than the feedback network would provide the required phase shift amount to have 0 degrees total. There are many well known phase shift networks that can be used as part of feedback network such as the twin T and the Wien bridge.

This oscillator will only oscillate when the loop gain of the amplifier and feedback network is at least one and the phase shift is zero. The oscillator state can readily be detected. When oscillating a AC signal is present and when not oscillating, no AC signal is present. This AC signal may also directly be used as a output signal indicating the loop gain level or preferably a detector connected to the oscillator provides the desired type of output signal, indicating if the AC signal is present or not and in some cases the level of the AC signal.

The amplifier section has a high temperature and voltage stability due to its reliance on component ratios to set circuit thresholds operating values. Resistor networks can be used in the amplifier section to increase phase and gain stability against the effects of temperature and voltage. One well know approach is to use a high gain amplifier which uses negative feedback to accurately set the amplifier section's gain. The negative feedback is optimally obtained by using a resistor divider network in which the resistor temperature and voltage characteristics are matched. The effects of temperature on the resistor network are then decreased. This also decreases the effects on the amplifier section since the gain of it is primarily determined by the resistor divider network.

The feedback network can also use circuits that depend on the ratio of circuit components, including capacitors, inductors, and resistors, to provide stable gain over temperature.

There are many well known methods for implementing oscillator gain varying elements depending on the selected transducers type. One method is to use signal controlled variable impedance devices. Some examples for use with a voltage input signal are variable resistors obtained by using a FET with it's gate connected to input. An other approach is a variable capacitor type using a reverse biased semiconductor junction such as a diode. As the DC voltage across the diode is varied it's capacitance also varies. Also a current input signal can be applied by using as one example a variable inductor obtained by using a inductor with a ferrite core which uses the current through it to vary it's inductance. Physical input signals can be applied by using as one example a variable capacitor such as a MEMS capacitor in which the physical spacing of the capacitor plates and resulting capacitance value are varied in response to the input signal level.

Likewise there are many well known methods for obtaining signal controlled variable gain devices. An example of this are transistors. The transistor's gain is varied by varying it's DC operating current level in response to input thus obtaining a signal controlled variable gain device. Also, the inductive coupling (mutual inductance) between inductors may be changed in response to an input signal.

A comparator is formed by using two or more transducers that receive input signals. The input signals levels are compared by using the transducer's output signals to vary the oscillator's loop gain. As the ratio of transducer's impedance or gain level varies, the loop gain also varies. When the transducers change the loop gain to less than one, the oscillation stops and the output indicates that no AC signal is present. The AC signal level being zero or not zero therefore indicates the comparison of the two transducer's input signal levels. To form a sensor measuring system from the comparator system one of the transducers is replaced with a fixed known impedance or gain level so that there is only one input signal.

It is also possible to provide an analog output signal level representing a sensor measuring system signal input level. By using the input signal level and negative feedback of the oscillator's AC signal level to both control the oscillator's loop gain. As the input signal level changes the loop gain, the AC signal level also changes so as to just maintain oscillation, keeping the loop gain value at or close to one. The oscillator's AC signal level therefore indicates the transducer input signal level.

An output signal level indicating the comparator's two input signal ratio level or the sensor measuring system input signal level can also be obtained by changing the oscillator loop gain in response to the input signal levels and a independent gain control signal and monitoring whether the oscillator is oscillating or not. The value of the independent gain control signal represents the comparator's two inputs signals ratio level or the sensor's input signal level when the oscillator's AC signal level changes from not zero to zero or vice a versa.

The independent gain control signal maybe a digital signal or can be converted to a digital signal to provide a digital output signal. Also a detector may be connected to the oscillator output indicating if the AC signal is present or not with the preferred type of signal, such as a digital high/low.

A reference signal system can be formed by further eliminating all input signals and just using negative feedback of the oscillator's AC signal level to control the oscillator's loop gain. The oscillator's AC signal level controls a gain varying element of the oscillator. As the oscillator's AC signal level varies the loop gain varies. The oscillator's AC signal level is of a value that just maintains oscillation by keeping the loop gain value at or close to one. Since in the reference signal system all gain levels are constant except that controlled by the oscillator's AC signal level, the oscillator's AC signal level also remains a constant signal level that can be used as a reference. In addition, a detector having it's output signal level controlled by the AC signal level can be used to provide at it's output the preferred type of output signal, such as for example a voltage or current.

It is also understood that varying the phase of the oscillator's amplifier and feedback network loop will also control the oscillator's ability to oscillate. Alternatively in the above applications the transducers may be used to control the oscillator's loop phase instead of gain.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments.

DETAILED DESCRIPTION OF THE INVENTION

Figure 1:
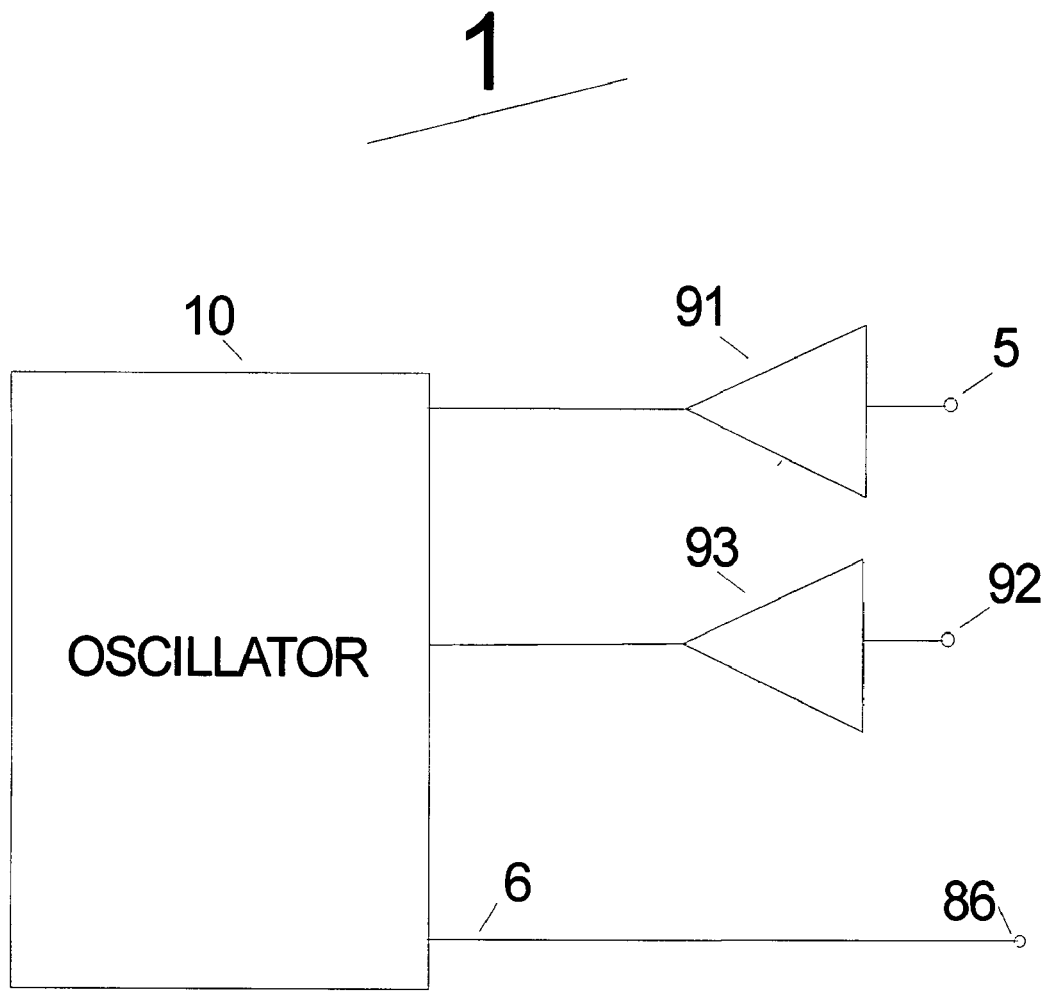
FIG. 1 shows a block diagram of comparator system 1.

An embodiment of the invention is shown in FIG. 1. The comparator system 1 comprising oscillator 10, transducer 91, and transducer 93. Oscillator 10 receives signals to it's gain control inputs from transducer 91 and transducer 93. The output of oscillator 10 is on line 6 which is connected to terminal 86. Transducer 91 receives input at input 5 and transducer 93 receives input at input 92. It is also understood that additional transducers with their respective inputs can also be used.

As the signal level of input 5 varies in comparison to input 92, the ratio of the transducer's impedance or gain level also varies which in turn varies the loop gain. When the loop gain of oscillator 10 is reduced below the value of one, the oscillation stops, and the AC signal level on line 6 becomes zero.

Figure 2:
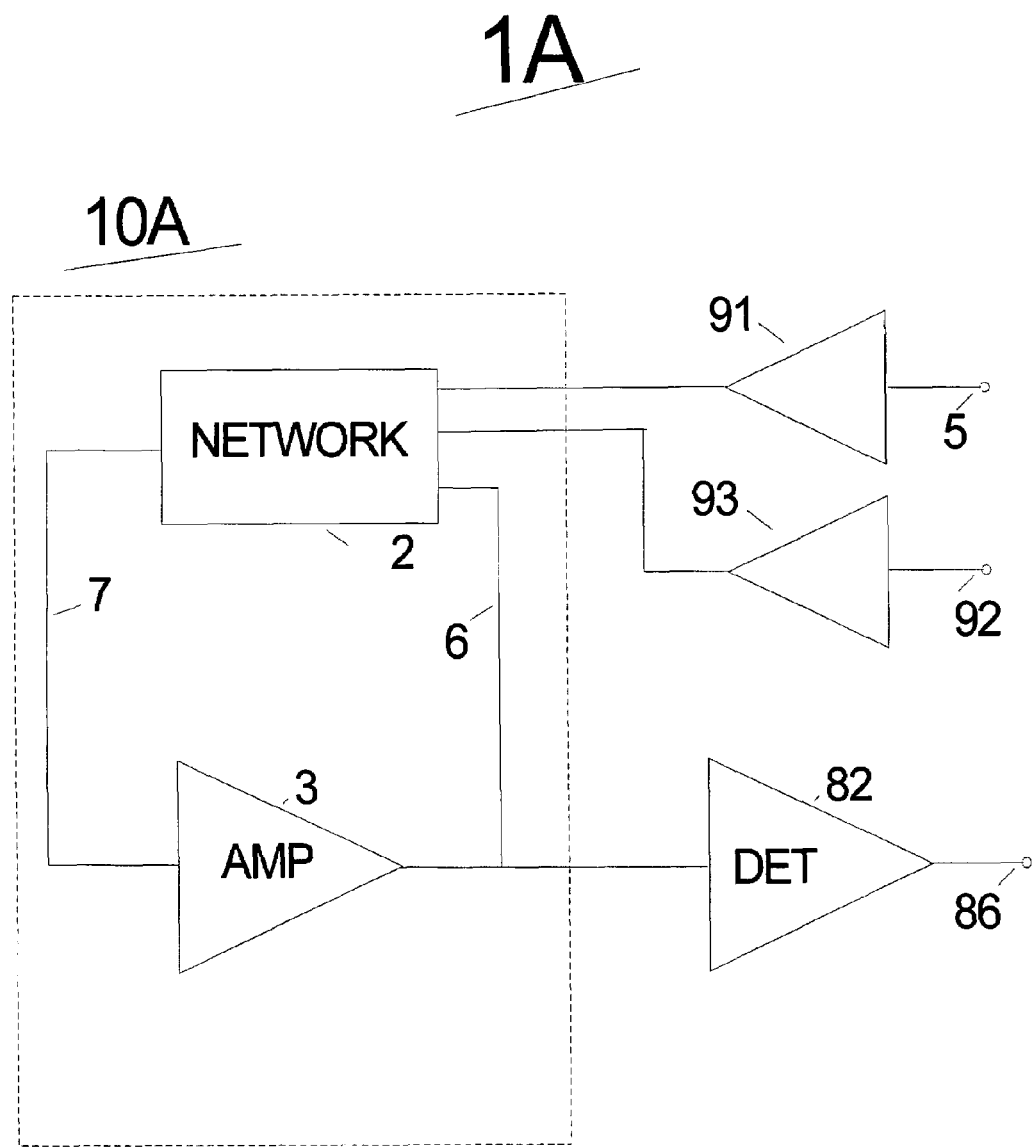
FIG. 2 shows a block diagram of comparator system 1A.

Another embodiment of the invention is shown in FIG. 2. The comparator system 1A comprising transducer 91, transducer 93, detector 82, and oscillator 10A comprising feedback network 2 and amplifier 3. Feedback network 2 is connected to the input and output of amplifier 3 by lines 7 and 6 so as to be capable of oscillating.

Feedback network 2 also receives gain control input signals from transducer 91, and transducer 93. The output of amplifier 3 is also connected to detector 82 input. The output signal of detector 82 is at terminal 86. An AC signal is present on line 6 only when the oscillator 10A is oscillating and detector 82 indicates whether or not an AC signal is present on line 6. Detector 82 converts the signal on line 6 to the type of output signal desired at terminal 86, which for example can be a digital signal.

As the ratio of signal level of input 5 to input 92 varies and changes the loop gain of feedback network 2 and amplifier 3 lower than the value of one, oscillator 10A stops oscillating. The AC signal level on line 6 at the detector 82 input becomes zero and the digital signal at terminal 86 changes state, for example from a high to a low level. Thus the digital signal at terminal 86 is controlled by the ratio of signal level of input 5 to input 92.

Figure 3:
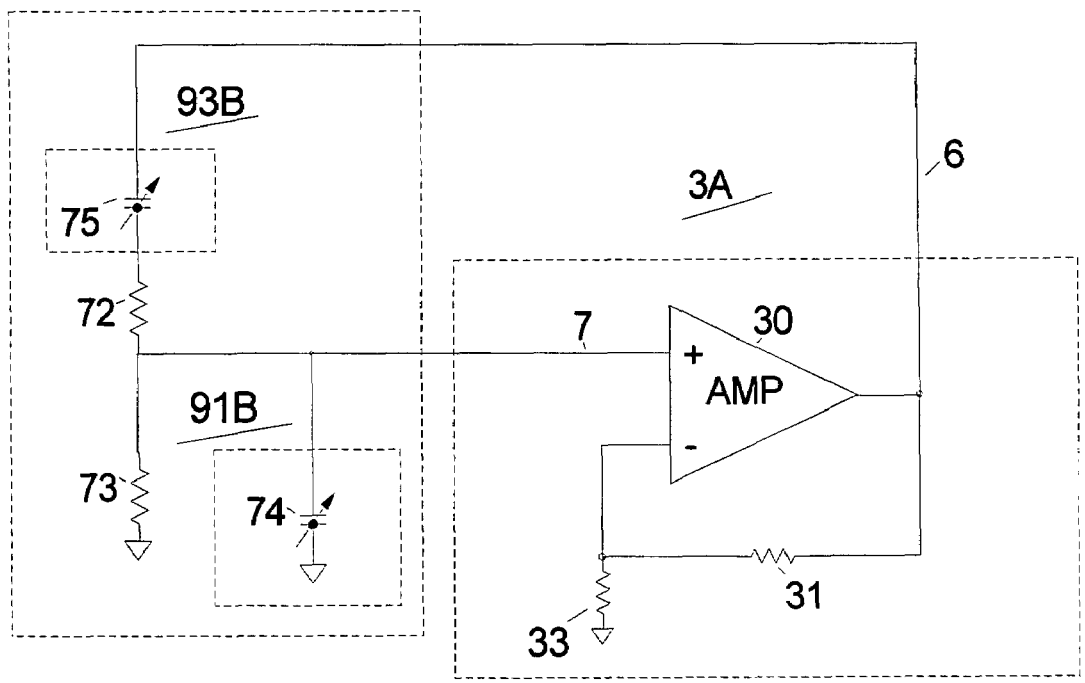
FIG. 3 shows a diagram of oscillator system 10B.

Referring now to oscillator system 10B in FIG. 3. Oscillator 10B consist of feedback network 2A and amplifier 3A. Oscillator 10B is a variation of the well known by those skilled in the art, Wien bridge oscillator. Amplifier 3A is shown implemented using an OP-AMP with gain setting resistors. The output of OP-AMP 30 is connected to line 6 and it's positive input is connected to line 7. It's negative input is connected to one end of resistors 31 and resistor 33. The other end of resistor 31 is connected to line 6 and the other end of resistor 33 is connected to ground. The gain of amplifier 3A is a function of the resistance ratio of resistor 31 and resistor 33 since the gain of OP-AMP 30 is much greater than the gain set by the resistors 31 and resistor 33.

Feedback network 2A provides phase shift dependant on frequency. The input signal to feedback network 2A is connected by line 6 and the output signal is applied to line 7. Transducer 91B is implemented by transducer capacitor 74. Transducer 93B is implemented by transducer capacitor 75. Transducer capacitor 75 is connected between line 6 and resistor 72. The other side of resistor 72 is connected to line 7, resistor 73 and transducer capacitor 74. The other side of resistor 73 and transducer capacitor 74 are connected to ground.

The capacitance of transducer capacitor 74 is varied by the signal at input 5. The capacitance of transducer capacitor 75 is varied by the signal at input 92. By changing the capacitance of transducer capacitor 74 or 75, it' impedance is changed. Thus transducer capacitor 74 and 75 both function as variable impedance transducers. The usual practice is to set resistors 73 and 72 equal value and that of transducer capacitors 75 and 74 nearly equal, but other combinations can also be used. As the impedance ratio of transducer capacitor 74 to transducer capacitor 75 varies the gain of feedback network 2A also varies.

Figure 4:
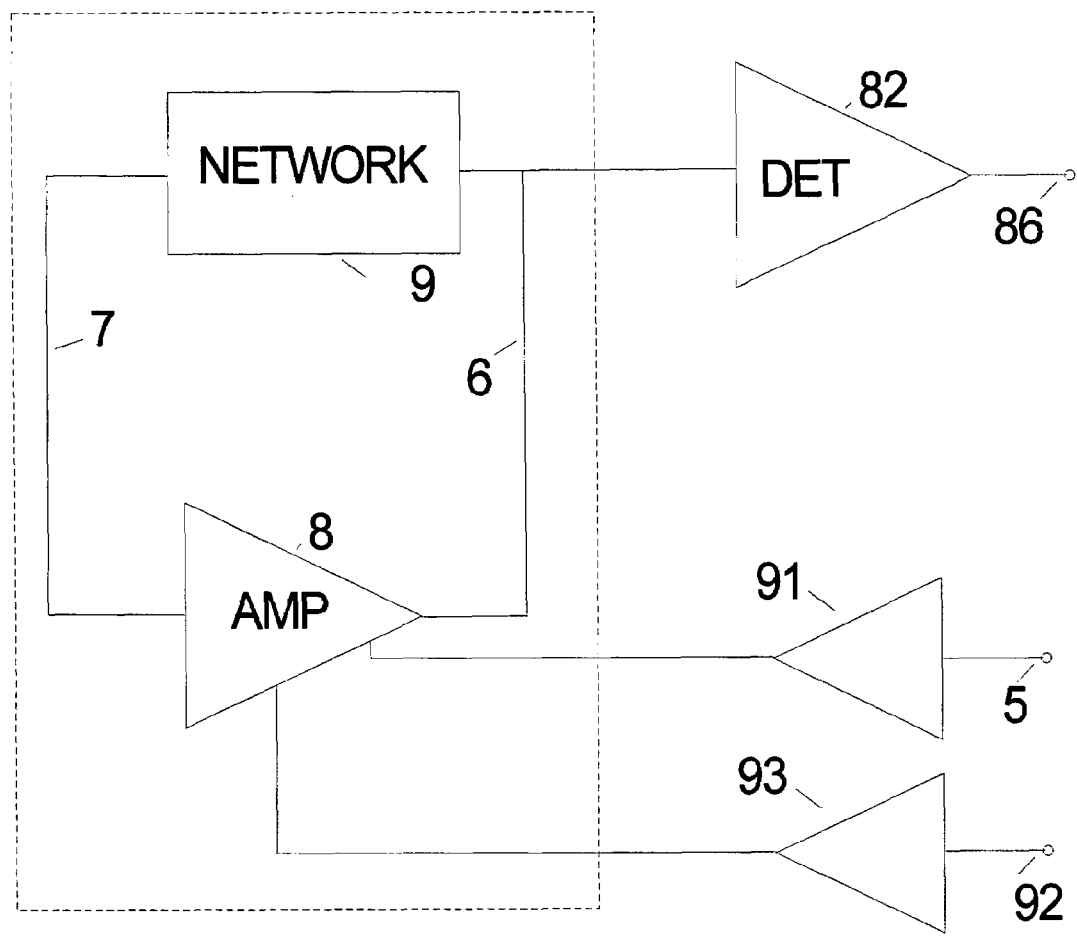
FIG. 4 shows a block diagram of comparator system 1B.

Alternatively in comparator system 1B shown in FIG. 4, the transducer 91 and transducer 93, outputs are connected to the amplifier instead of feedback network 2. Amplifier 8 is a variable gain amplifier whose gain is controlled by one or more input signals. In this case amplifier 8 receives gain control signals from the outputs of transducer 91 and transducer 93.

Figure 5:
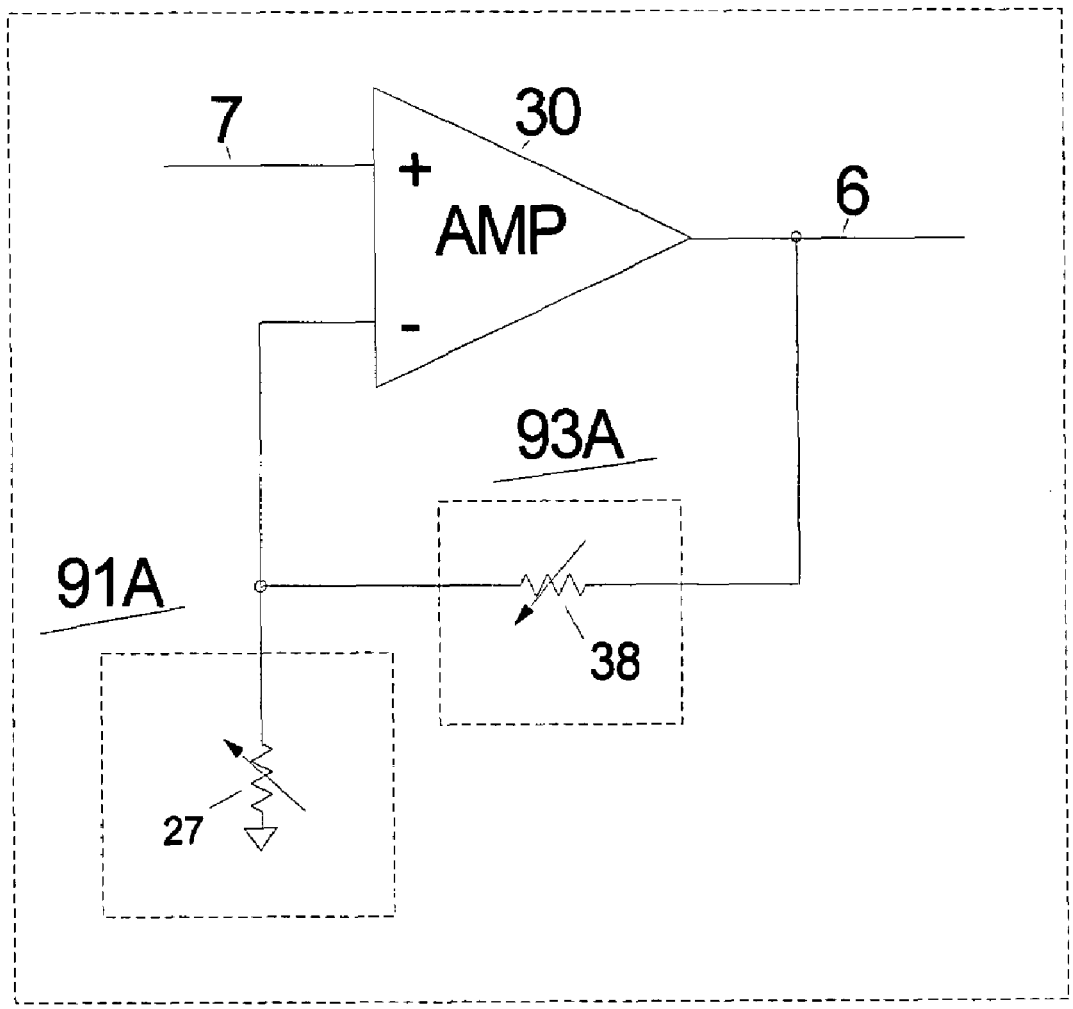
FIG. 5 shows a diagram of the amplifier system 8A.

A version of Amplifier 8 is shown in FIG. 5. Amplifier 8A is implemented using OP-AMP 30. Transducer 91A is implemented by transducer resistor 27 which has it's resistance controlled by the signal at input 5. Transducer 93A is implemented by transducer resistor 38 which has it's resistance controlled by the signal at input 92. The output of OP-AMP 30 is connected to line 6 and it's positive input is connected to line 7. It's negative input is connected to one end of and transducer resistor 38 and transducer resistor 27. The other end of transducer resistor 38 is connected to line 6 and the other end of transducer resistor 27 is connected to ground.

The gain of amplifier 8A is a function of the resistance ratio of transducer resistor 38 and transducer resistor 27 since the gain of OP-AMP 30 is much greater than the gain set by the transducer resistors 38 and transducer resistor 27. Using this approach, amplifier 8A has stable phase shift and gain verses temperature and voltage, but the gain varies only as a function of the ratio of input 5 to input 92.

Figure 6:
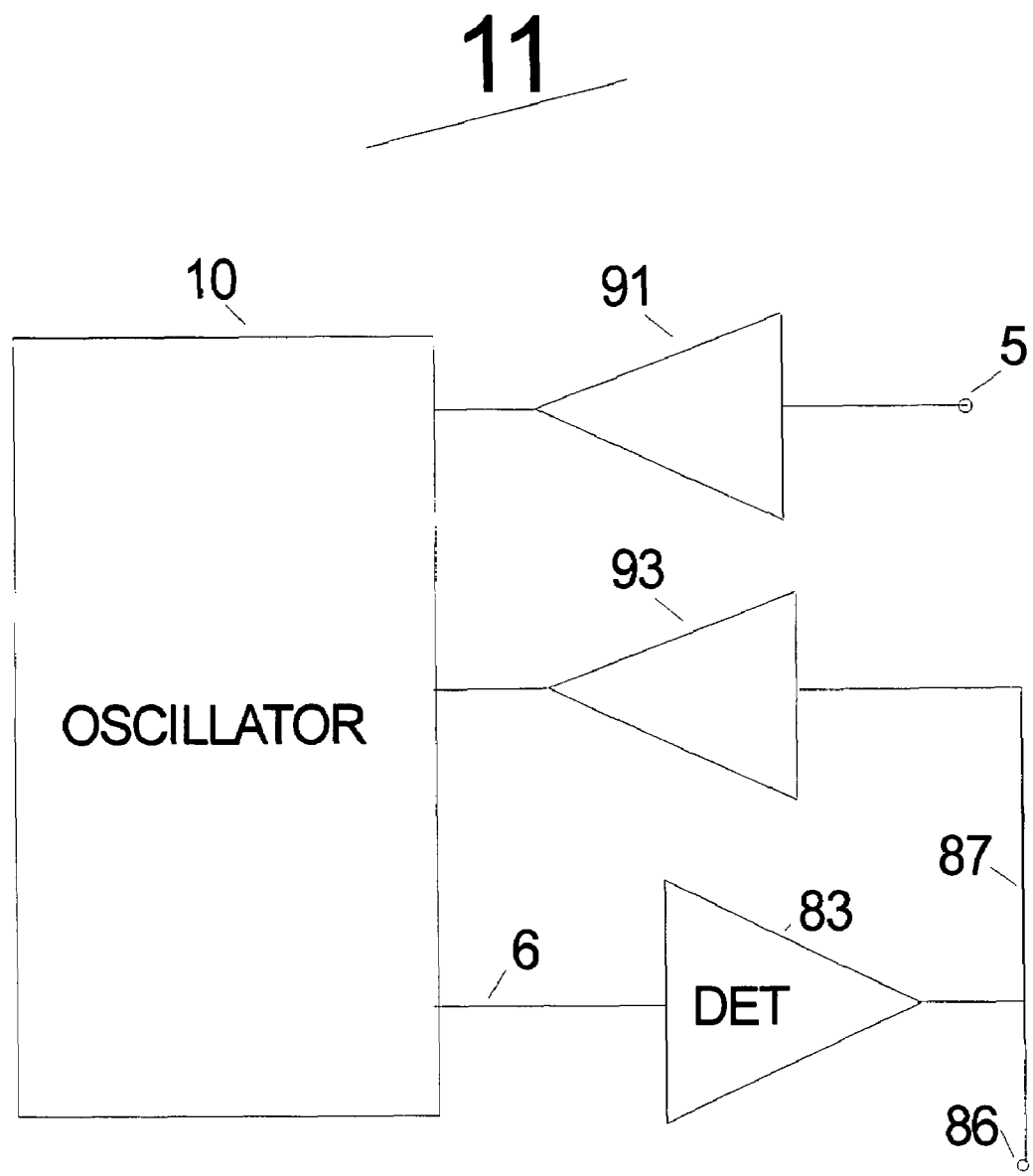
FIG. 6 shows a block diagram of sensor measurement system 11.

A sensor measuring system embodiment of the invention is shown in FIG. 6. The sensor measuring system 11 comprising oscillator 10, transducer 91, transducer 93 and detector 83. Oscillator 10 receives signals to it's gain control inputs from transducer 91 and transducer 93. The output of oscillator 10 is on line 6 which is connected to the detector 83 input. Detector 83 converts the signal on line 6 to the type of output signal desired on line 87 and at terminal 86. The output signal of detector 83 on line 87 is applied to the input of transducer 93 and also terminal 86. Alternatively if an AC signal is compatible with transducer 93 input, the signal on line 6 can be directly connected to line 87 and terminal 86 without detector 83 being used, or using detector 83 only to convert the signal on line 6 to the type of output signal desired at terminal 86. Transducer 91 receives input at input 5. It is understood that multiple transducers can also be used.

The signals at input 5 and detector 83 output are both used to control the oscillator's loop gain. As the signal level of input 5 varies the transducer 91 impedance or gain also varies which in turn varies the loop gain. The detector 83 output also controls the loop gain through transducer 93. The output signal of detector 83 is a signal proportional to the AC signal level on line 6. As the AC signal level on line 6 increases the loop gain of oscillator 10 is reduced. As the transducer 91 output changes the loop gain, the AC signal level on line 6 also changes so as to just maintain oscillation with a loop gain at or close to one. Thus the signal level at terminal 86 is controlled by the signal level at input 5.

Figure 7:
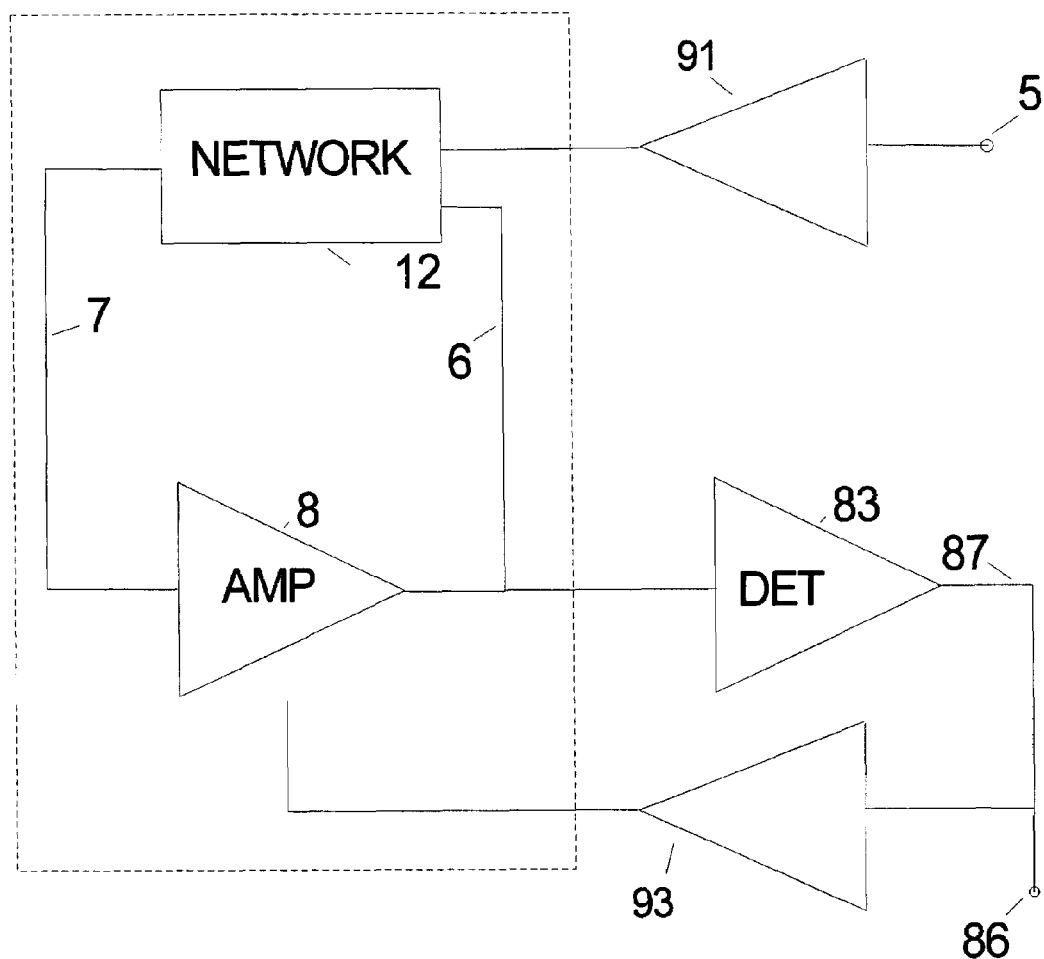
FIG. 7 shows a block diagram of sensor measurement system 11A.

Another embodiment of the sensor measuring system is shown in FIG. 7. The sensor measuring system 11A comprising oscillator 10D, transducer 91, transducer 93 and detector 83. Oscillator 10D contains feedback network 12 and amplifier 8. Feedback network 12 is connected to the input and output of amplifier 8 by lines 6 and 7 so as to be capable of oscillating. Feedback network 12 also receives a gain control input signal from transducer 91. Transducer 91 receives input signal at input 5. Detector 83 is also connected to line 6. An AC signal is present on line 6 only when the system is oscillating. The output signal of detector 83 on line 87 is applied to the input of transducer 93 and also terminal 86. The output of transducer 93 is connected to the gain control input of amplifier 8. Alternatively the transducer 91 output can be connected to amplifier 8 instead of feedback network 12 and the output signal of transducer 93 applied to a gain control input of feedback network 12.

The signals at input 5 and detector 83 output are both used to control the oscillator's loop gain. As the signal level of input 5 varies, the transducer's impedance or gain also varies, which in turn varies the loop gain. The detector 83 output also controls the loop gain through transducer 93. The output signal of detector 83 is a signal proportional to the AC signal level at it's input. As the output signal level of detector 83 increases, the loop gain of oscillator 10D is reduced. As the transducer 91 output changes the loop gain the detector 83 output also changes so as to just maintain oscillation with a loop gain at or close to one. Thus the signal level at terminal 86 is controlled by the signal level at input 5.

Figure 8:
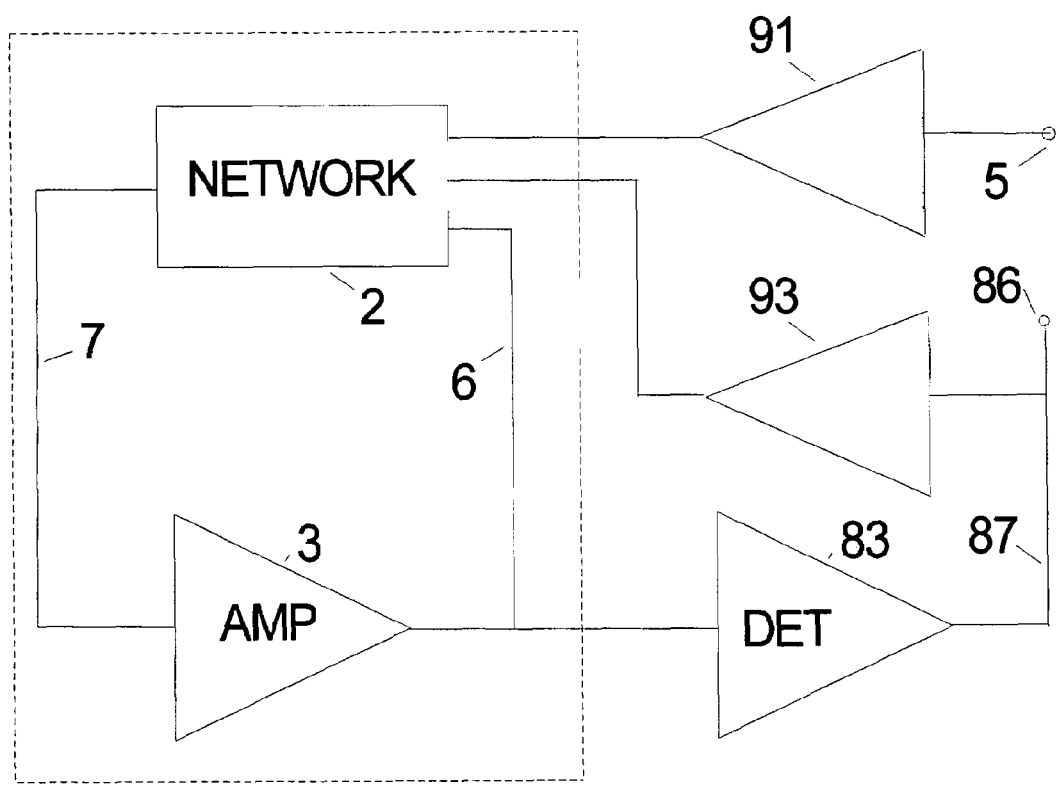
FIG. 8 shows a block diagram of sensor measurement system 11B.

Another embodiment of the invention is shown in FIG. 8. The sensor measuring system 11B comprising transducer 91, transducer 93, detector 83, and oscillator 10A comprising feedback network 2 and amplifier 3. Feedback network 2 is connected to the input and output of amplifier 3 by lines 6 and 7 so as to be capable of oscillating. Feedback network 2 also receives gain control input signals from transducer 91, and transducer 93. The output of amplifier 3 is also connected to detector 83. An AC signal is present on line 6 only when the system is oscillating. The output signal of detector 83 is on line 87 and also at terminal 86. The output signal of detector 83 on line 87 is applied to the input of transducer 93 and also terminal 86. Transducer 91 receives input at input 5. It is understood that multiple transducers can also be used.

The output signal of detector 83 is a signal proportional to the AC signal level at it's input. As the output signal level of detector 83 increases the gain of feedback network 2 is decreased. The gain of feedback network 2 is also controlled by the output signal level of transducer 91. As the signal level of input 5 varies and changes the loop gain of feedback network 2 and amplifier 3, the signal level on line 87 varies to keep the loop gain at or close to the value of one such that the system just maintains oscillation. Thus the signal level at terminal 86 is controlled by the signal level at input 5.

Figure 9:
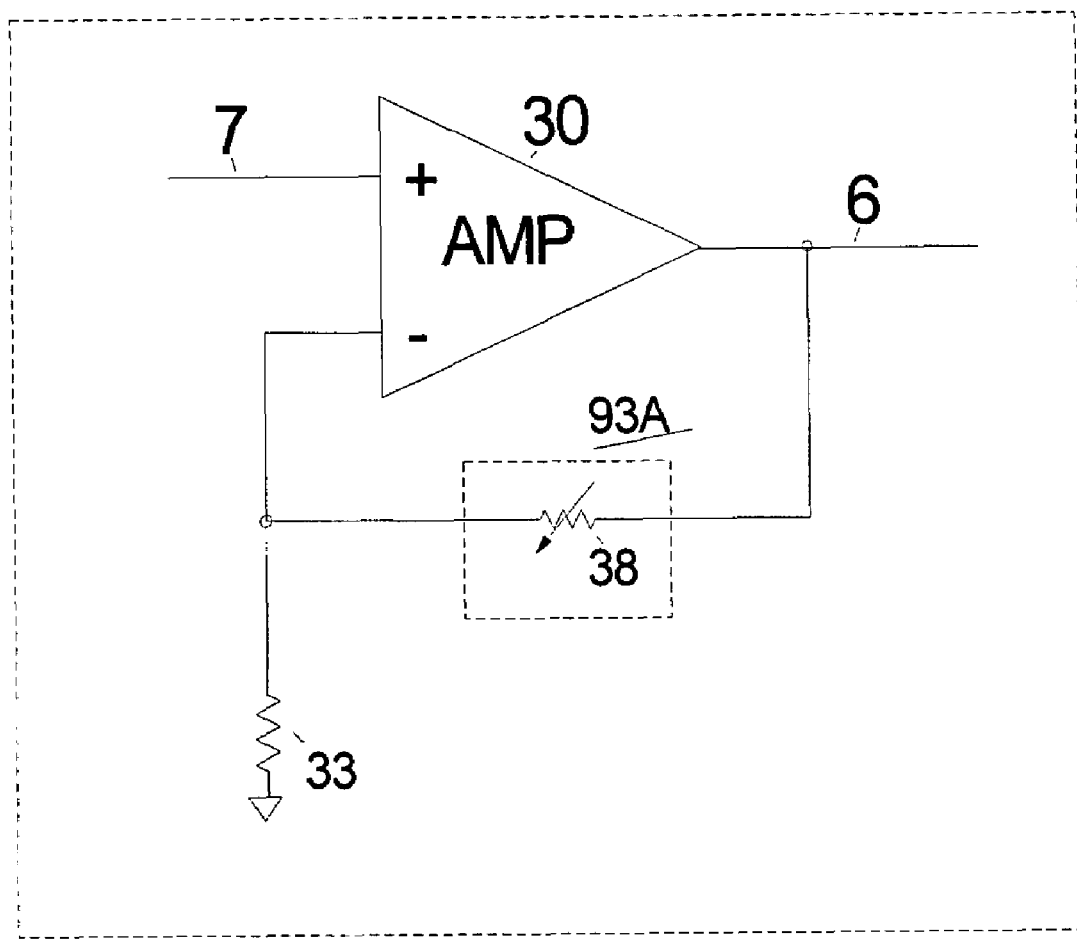
FIG. 9 shows a diagram of the amplifier system 8B.

Amplifier 8B shown in FIG. 9 is implemented using an OP-AMP 30 with resistor 33 and transducer 93A. Transducer 93A is implemented by transducer resistor 38. The output of OP-AMP 30 connected to line 6 and it's positive input is connected to line 7. It's negative input is connected to one end of resistor 33 and transducer resistor 38. The other end of transducer resistor 38 is connected to line 6 and the other end of resistor 33 is connected to ground. The resistance ratio of resistor 33 to transducer resistor 38 determines the gain of amplifier 8B since the gain of OP-AMP 30 is much greater than the gain set by the resistors 33 and transducer resistor 38. Using this approach, amplifier 8B has stable phase shift and gain verses temperature and voltage, but the gain varies only in accordance with the input signal of transducer 93A.

It is also understood that resistor 33 can be replaced by a transducer resistor. The gain of amplifier 8B is now determined by the resistance ratio of two transducer resistors. When the same input signal is applied to both of them such that the impedance of one transducer resistor increases while the other decreases, the sensitivity of amplifier 8B to the input signal is increased while further reducing temperature dependence.

Figure 10:
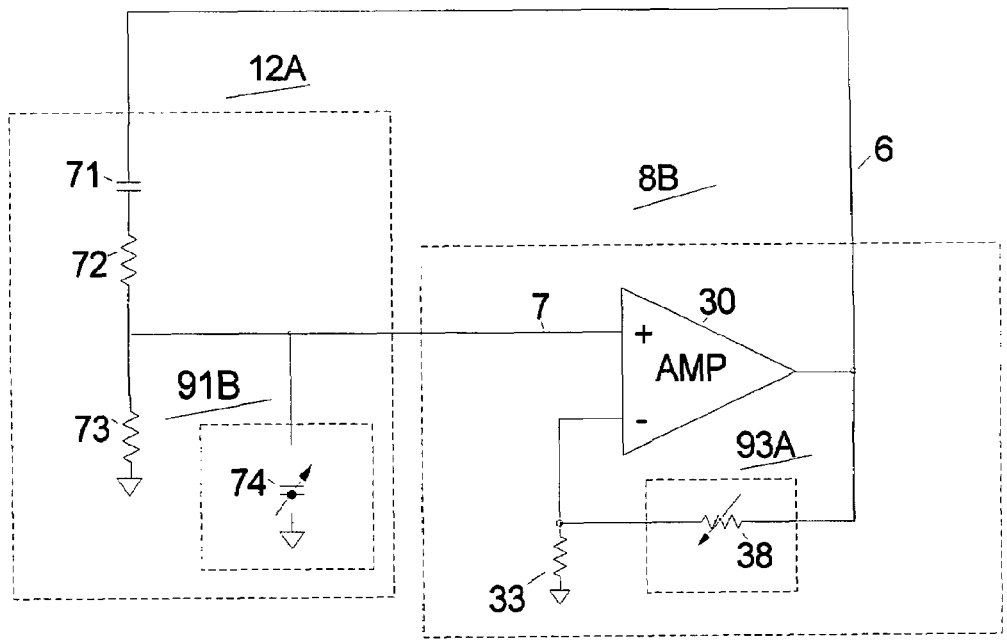
FIG. 10 shows a diagram of oscillator system 10E.

Referring now to oscillator system 10E in FIG. 10. Oscillator 10E consist of feedback network 12A and amplifier 8B. Oscillator 10E is a variation of the well known by those skilled in the art, Wien bridge oscillator.

Feedback network 12A provides phase shift dependant on frequency. The input signal to feedback network 12A is connected by line 6 and the output signal is applied to line 7. Transducer 91B is implemented by transducer capacitor 74. Capacitor 71 is connected between line 6 and resistor 72. The other side of resistor 72 is connected to line 7, resistor 73 and transducer capacitor 74. The other sides of resistor 73 and transducer capacitor 74 are connected to ground.

The capacitance of transducer capacitor 74 is varied by the signal level at input 5. By changing the capacitance of transducer capacitor 74 it' impedance is changed. Thus transducer capacitor 74 functions as variable impedance transducer. The usual practice is to set resistors 73 and 72 equal value and that of capacitors 71 and 74 close in value, but other combinations can also be used. As the value of transducer capacitor 74 varies the gain of feedback network 12A also varies.

Figure 11:
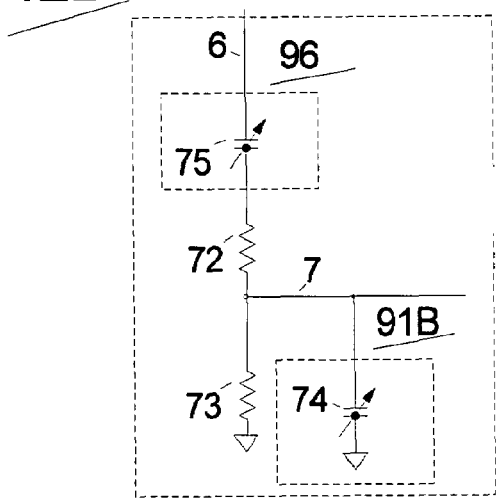
FIG. 11 shows a diagram of feedback network 12B.

Referring now to FIG. 11 is feedback network 12B which is the same as feedback network 12A except that capacitor 71 is replaced by transducer 96 which is implemented by transducer capacitor 75. Transducer capacitor 75 and transducer capacitor 74 both function as variable impedance transducers. The same signal at input 5, is applied to both of them so that the capacitance of one transducer capacitor increases while the other decreases thus increasing the sensitivity of feedback network 12B to input 5 while further reducing temperature dependence.

Figure 12:
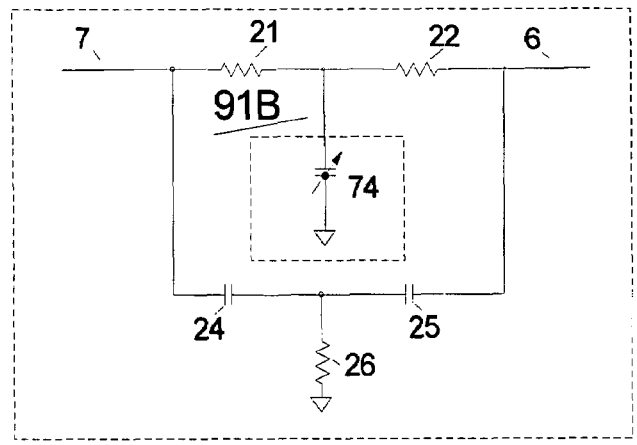
FIG. 12 shows a diagram of feedback network 2C.

Referring now to feedback network 12C in FIG. 12 which is the well known twin T network that is used with a phase inverter amplifier to provide the phase shift needed for oscillation to be possible. Transducer 91B is implemented by transducer capacitor 74. Capacitor 25 is connected between line 6 and resistor 26 and capacitor 24. The other side of capacitor 24 is connected to line 7. Resistor 22 is connected between line 6 and transducer capacitor 74 and resistor 21. The other side of resistor 21 is connected to line 7. The other sides of resistor 26 and transducer capacitor 74 are connected to ground.

The usual practice is to use resistors 21 and 22 of equal value and also equal value capacitors 24 and 25. Resistor 26 is set to ½ the value of resistor 21. As the capacitance of transducer capacitor 74 approaches twice the value of capacitor 24 the gain of feedback network 12C approaches zero.

Figure 13:
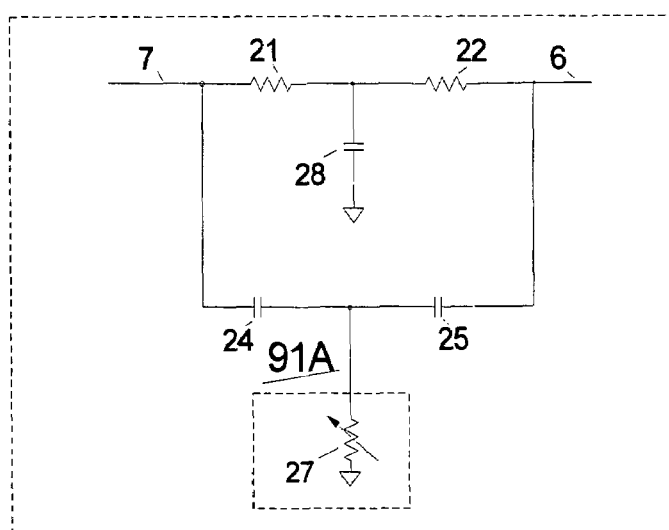
FIG. 13 shows a diagram of feedback network 2D.

Referring now to FIG. 13 is feedback network 12D which is the same a feedback network 12C except that transducer capacitor 74 is replaced by capacitor 28 and resistor 26 is replaced by transducer 91A. Transducer 91A is implemented by transducer resistor 27. Capacitor 28 is set to twice the capacitance of capacitor 24. The resistance of transducer resistor 27 is varied by the input signal of transducer 91A. Thus transducer resistor 27 functions as variable impedance transducer. As the resistance of transducer resistor 27 approaches ½ the value of resistor 21 the gain of feedback network 12D approaches zero.

Figure 14:
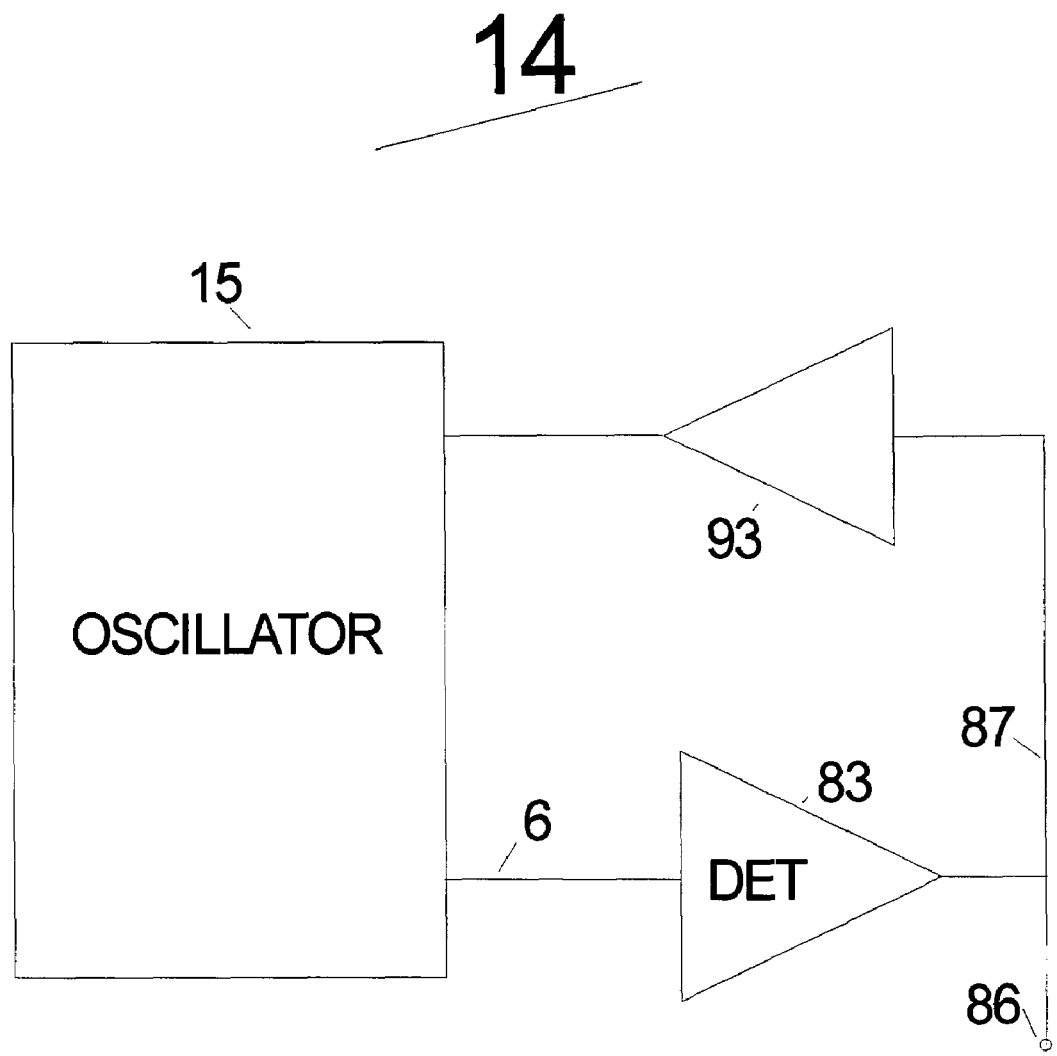
FIG. 14 shows a block diagram of reference system 14.

A reference system embodiment of the invention is shown in FIG. 14. The reference system 14 comprising oscillator 15, transducer 93, and detector 83. Oscillator 15 receives signals to it's gain control input from transducer 93. The output of oscillator 15 is on line 6 which is connected to the detector 83 input. Detector 83 converts the signal on line 6 to the type of output signal desired on line 87 and at terminal 86. The output signal of detector 83 on line 87 is applied to the input of transducer 93 and also terminal 86. In the case of a reference current system the output signal would be the current level through line 87, or in a voltage reference the voltage is on line 87. Alternatively if a AC signal is compatible with transducer 93 input, the signal on line 6 can be directly connected to line 87 and terminal 86 without detector 83 being used, or using detector 83 only to convert the signal on line 6 to the type of output signal desired at terminal 86.

Detector 83 is used to control the oscillator's loop gain. The detector 83 output signal applied to transducer 93 controls a gain varying element of the loop. It is understood that detector 83 may be connected to addition transducers controlling gain varying elements of the loop. The output signal level of detector 83, of which one form may be a DC voltage or current, is a signal proportional to the AC signal level at it's input. As the output signal level of detector 83 increases the loop gain of oscillator 15 is reduced. The detector output signal level is of a value that just maintains oscillation. In effect detector 83 provides negative feedback to maintain a low AC signal level on line 6 which occurs at a loop gain value at or close to one. The detectors output signal level therefore remains a constant value that can be used as a reference since the loop gain is constant except for the variation caused by the variation in the output of detector 83.

Figure 15:
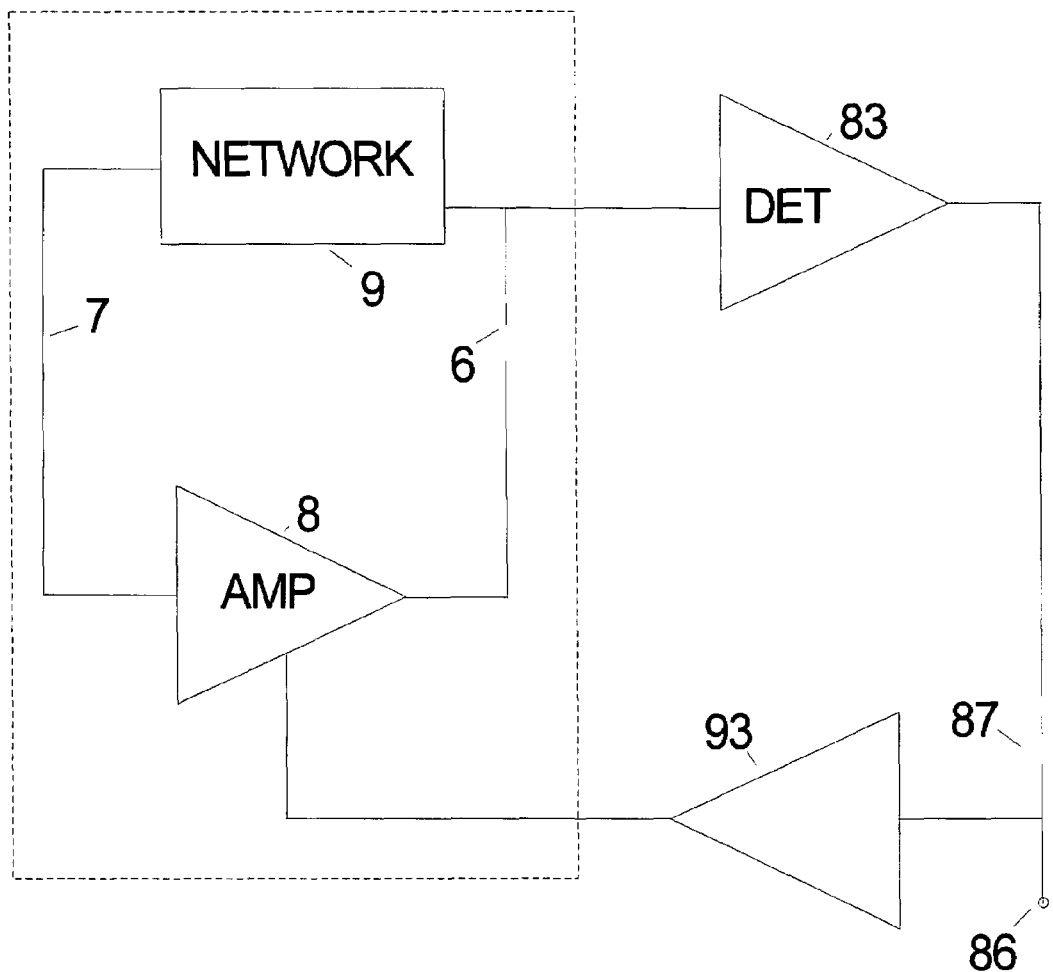
FIG. 15 shows a block diagram of reference system 14A.

Another embodiment of the invention is shown in FIG. 15. The reference system 14A comprising oscillator 15A, transducer 93, and detector 83. Oscillator 15A contains feedback network 9 and amplifier 8. Feedback network 9 is connected to the input and output of amplifier 8 by lines 6 and 7 so as to be capable of oscillating. The output of amplifier 8 is also connected to detector 83 input. An AC signal is present on line 6 only when the system is oscillating. The output signal of detector 83 on line 87 is applied through transducer 93 to the gain control input of amplifier 8 and also to terminal 86. The gain of amplifier 8 is varied in response to detector 83 output signal level.

The output signal level of detector 83 is proportional to the AC signal level at it's input. As the output signal level of detector 83 increases, the loop gain of feedback network 9 and amplifier 8 is reduced. The detector 83 output signal level is of a value that just maintains oscillation by keeping the loop gain value at or close to one. The detector 83 output signal level therefore remains a constant value.

Figure 16:
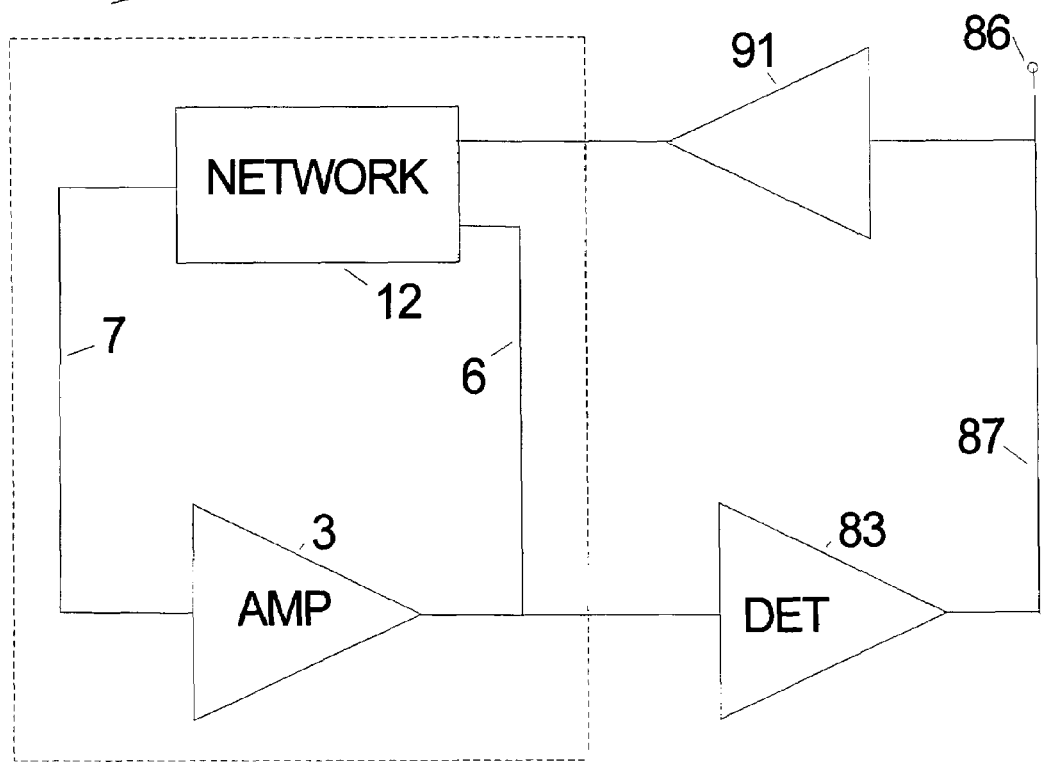
FIG. 16 shows a block diagram of reference system 14B.

Another embodiment of the invention is shown in FIG. 16. The reference system 14B comprising transducer 91, detector 83, and oscillator 15B comprising feedback network 12 and amplifier 3. Feedback network 12 is connected to the input and output of amplifier 3 by lines 6 and 7 so as to be capable of oscillating. Feedback network 12 also receives input signals from transducer 91. The output of amplifier 3 is also connected to detector 83. The output signal of detector 83 on line 87 is applied to transducer 91 and also terminal 86. An AC signal is present on line 6 only when the system is oscillating.

The output signal level of detector 83 is proportional to the AC signal level at it's input. As the output signal level of detector 83 increases the gain of feedback network 12 is decreased. The detector output signal level is of a value that just maintains oscillation by keeping the loop gain value at or close to one. The detector 83 output signal level therefore remains a constant value.

Figure 17:
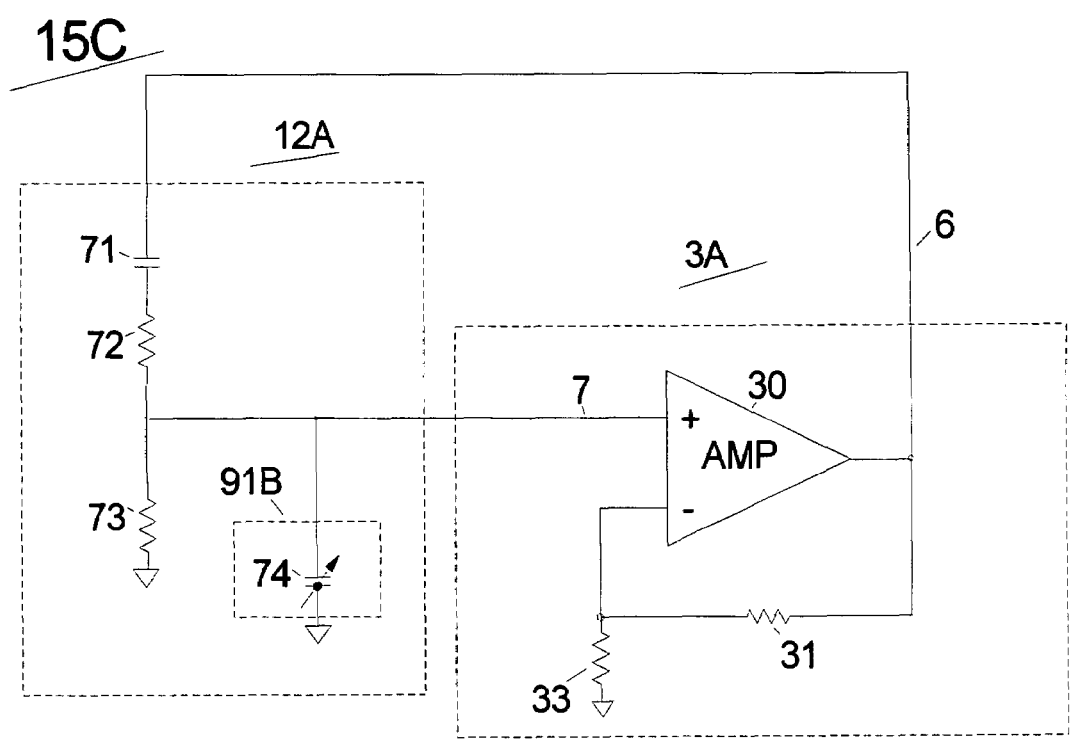
FIG. 17 shows a diagram of oscillator system 15C.

Referring now to oscillator system 15C in FIG. 17. Oscillator 15C consist of feedback network 12A and amplifier 3A. Oscillator 15C is a variation of the well known by those skilled in the art, Wien bridge oscillator.

Amplifier 3A is shown implemented using OP-AMP 30 with resistors 31 and 33. The output of OP-AMP 30 is connected to line 6 and it's positive input is connected to line 7. It's negative input is connected to one end of resistors 31 and resistor 33. The other end of resistor 31 is connected to line 6 and the other end of resistor 33 is connected to ground. The resistance ratio of resistor 31 and resistor 33 determines the gain of amplifier 3A since the gain of OP-AMP 30 is much greater than the gain set by the resistors 31 and resistor 33.

Feedback network 12A provides phase shift dependant on frequency. A input signal to feedback network 12A is on line 6 and the output signal is applied to line 7. Transducer 91B is implemented by transducer capacitor 74. Capacitor 71 is connected between line 6 and resistor 72. The other side of resistor 72 is connected to line 7, resistor 73 and transducer capacitor 74. The other sides of resistor 73 and transducer capacitor 74 are connected to ground. The capacitance of transducer capacitor 74 is varied by the signal level on line 87. By changing the capacitance of transducer capacitor 74 it' impedance is changed. The usual practice is to set resistors 73 and 72 equal value and that of capacitors 71 and 74 nearly equal, but other combinations can also be used. As the signal level on line 87 varies, the value of transducer capacitor 74 varies, causing the gain of feedback network 12A to also vary.

Figure 18:
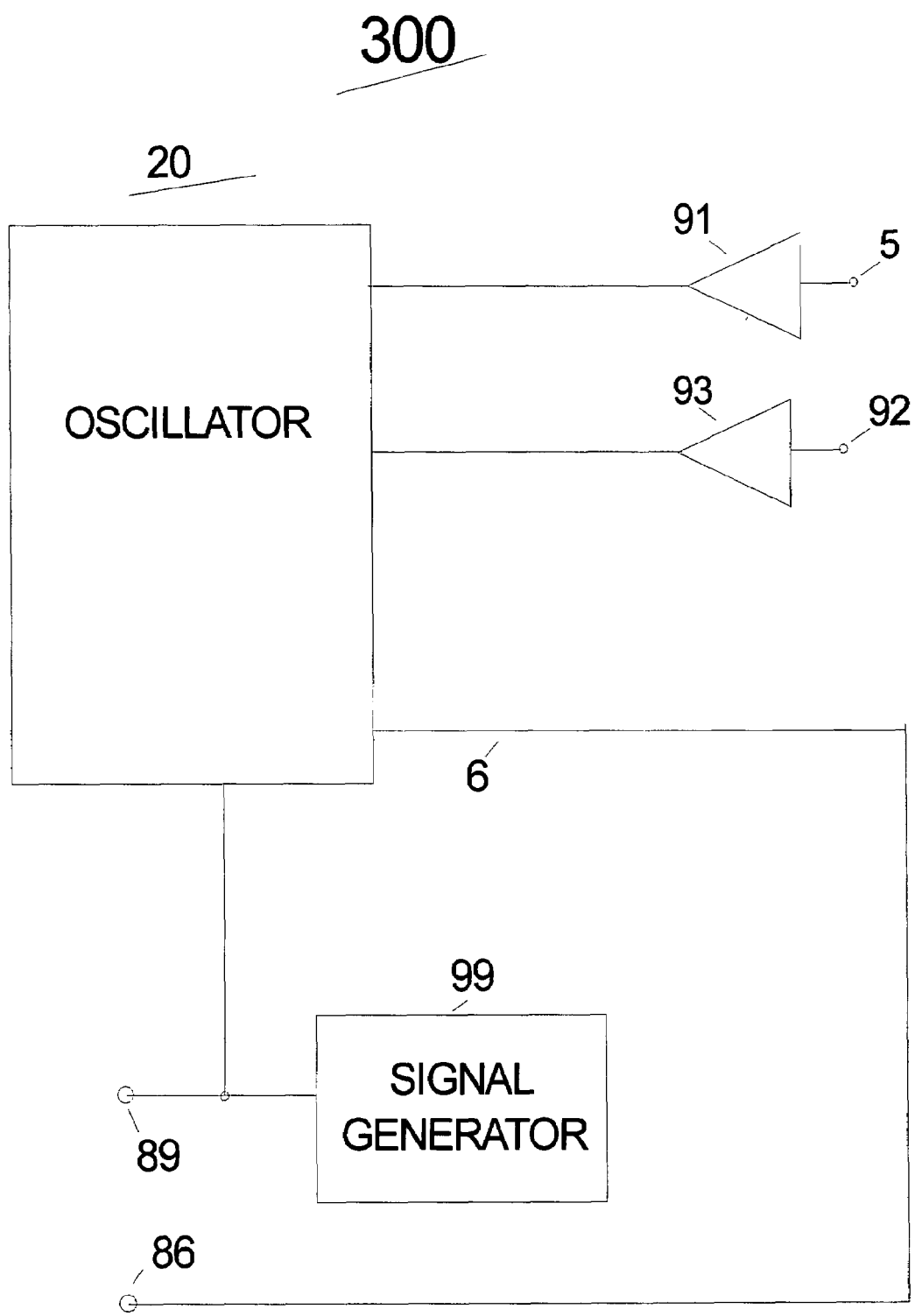
FIG. 18 shows a block diagram of analog to digital comparator measurement systems 300.

Referring now to FIG. 18, analog to digital comparator measurement systems 300 provides a output, which maybe digital, representing the value of the signal level ratio of the inputs applied to input 5 and input 92.

Transducers 91, and 93 outputs are connected to gain control inputs of oscillator 20 along with the output of signal generator 99. The oscillator 20 output on line 6 connected to terminal 86 is the presence or absence of an AC signal. The signal generator 99 output is a time varying signal that is connected to a gain control input of oscillator 20 and terminal 89. The signal generator 99 output signal maybe a digital signal or can be converted to a digital signal to provide a digital output signal. Signal generator 99 continually recycles through it's full output range.

The output signal level at terminal 86 changes when the oscillator 20 loop gain level increase above or decreases below the minimum loop gain value for oscillation to occur and be present on line 6. The level of oscillator 20 loop gain is a function of the signal level ratio of input 5 to input 92 and also the signal generator 99 output signal value. Since the signal generator 99 output also controls the level of oscillator 20 loop gain, the signal generator 99 output value at terminal 89 indicates the signal level ratio of input 5 to input 92 when the change from presence to absence or vice a versa of an AC signal occurs at terminal 86.

Figure 19:
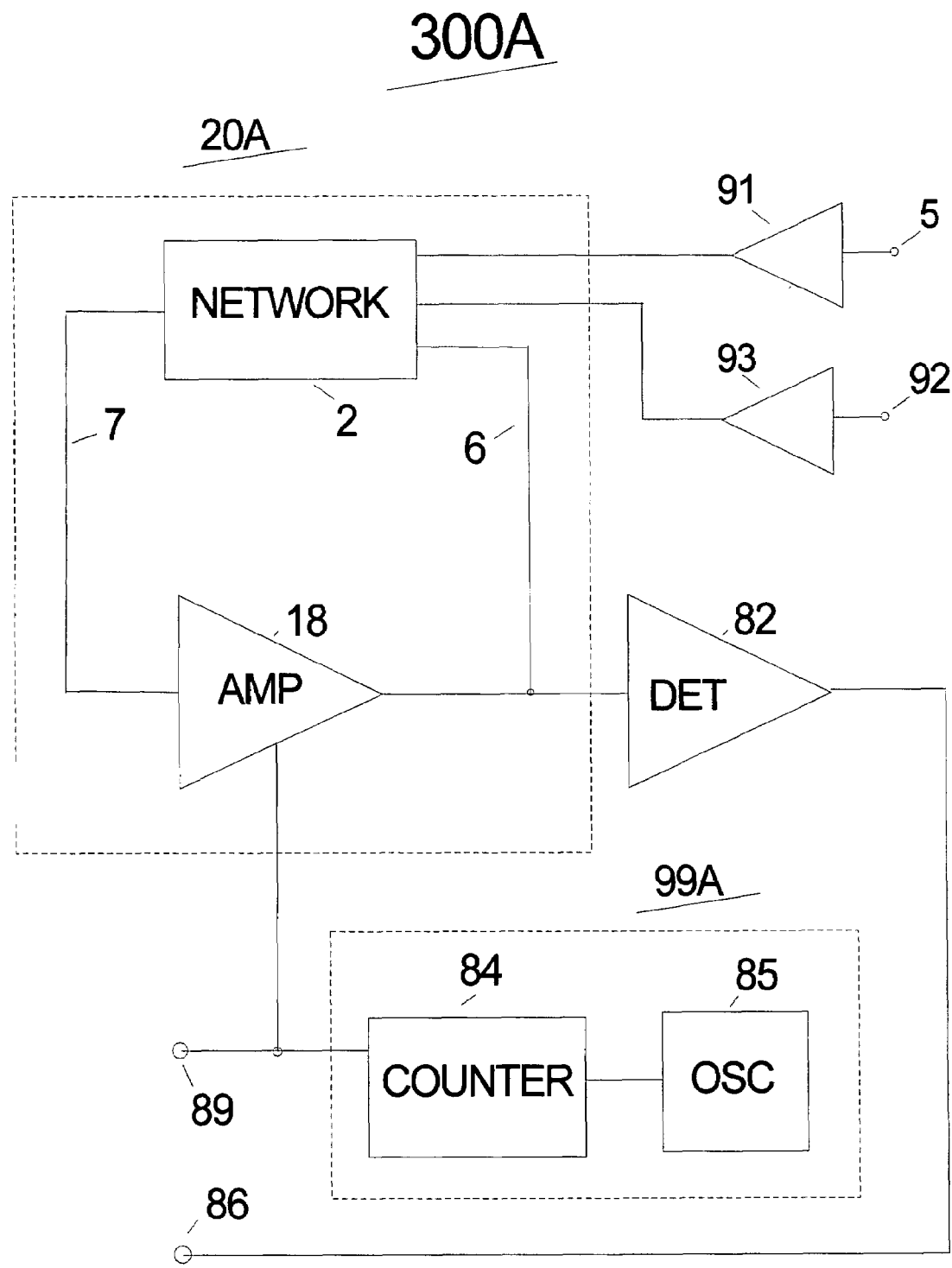
FIG. 19 shows a block diagram of analog to digital comparator measurement systems 300A.

Referring now to FIG. 19, is analog to digital comparator measurement systems 300A which provides a digital output representing the level of the ratio of input 5 to input 92 signal levels. Oscillator 20A consist of feedback network 2 and amplifier 18. Feedback network 2 is connected to the input and output of amplifier 18 by lines 6 and 7 so as to be capable of oscillating. Feedback network 2 also receives input signal from transducer 91 and transducer 93. Transducer 91 receives input signal from input 5 and transducer 93 receives input signal from input 92. The output of amplifier 18 is also connected to detector 82 input. The output signal of detector 82 is connected to terminal 86. This output signal is a digital signal indicating the presence or absence of an AC signal on line 6. Signal generator 99A consist of oscillator 85 and counter 84. Oscillator 85 is an independent oscillator. The frequency of oscillator 85 is lower than that of the AC signal when present on line 6. Counter 84 counts the number of oscillator 85 output cycles. The output of counter 84 is a digital signal which is connected to the gain control input of amplifier 18 and terminal 89. The counter 84 output signal value determines the gain level of amplifier 18. Counter 84 after reaching it's maximum count resets to zero and starts counting again.

The detector 82 output signal at terminal 86 changes when the loop gain level increase above or decreases below the minimum loop gain value for oscillation to occur and be present on line 6. The level of amplifier 18 gain required for oscillation is a function of the signal level ratio at input 5 to input 92. Since the counter 84 output signal value controls the level of amplifier 18 gain, counter 84 output signal value at terminal 89 also represents the level of the signal level ratio of input 5 to input 92 when the digital signal at terminal 86 changes state.

The preferred sequence of operation is for the counter to start with the gain of amplifier 18 much higher then required for oscillation to start, and then to reduce amplifier 18 gain. By starting at a high gain value the oscillation starts faster and more reliably.

Figure 20:
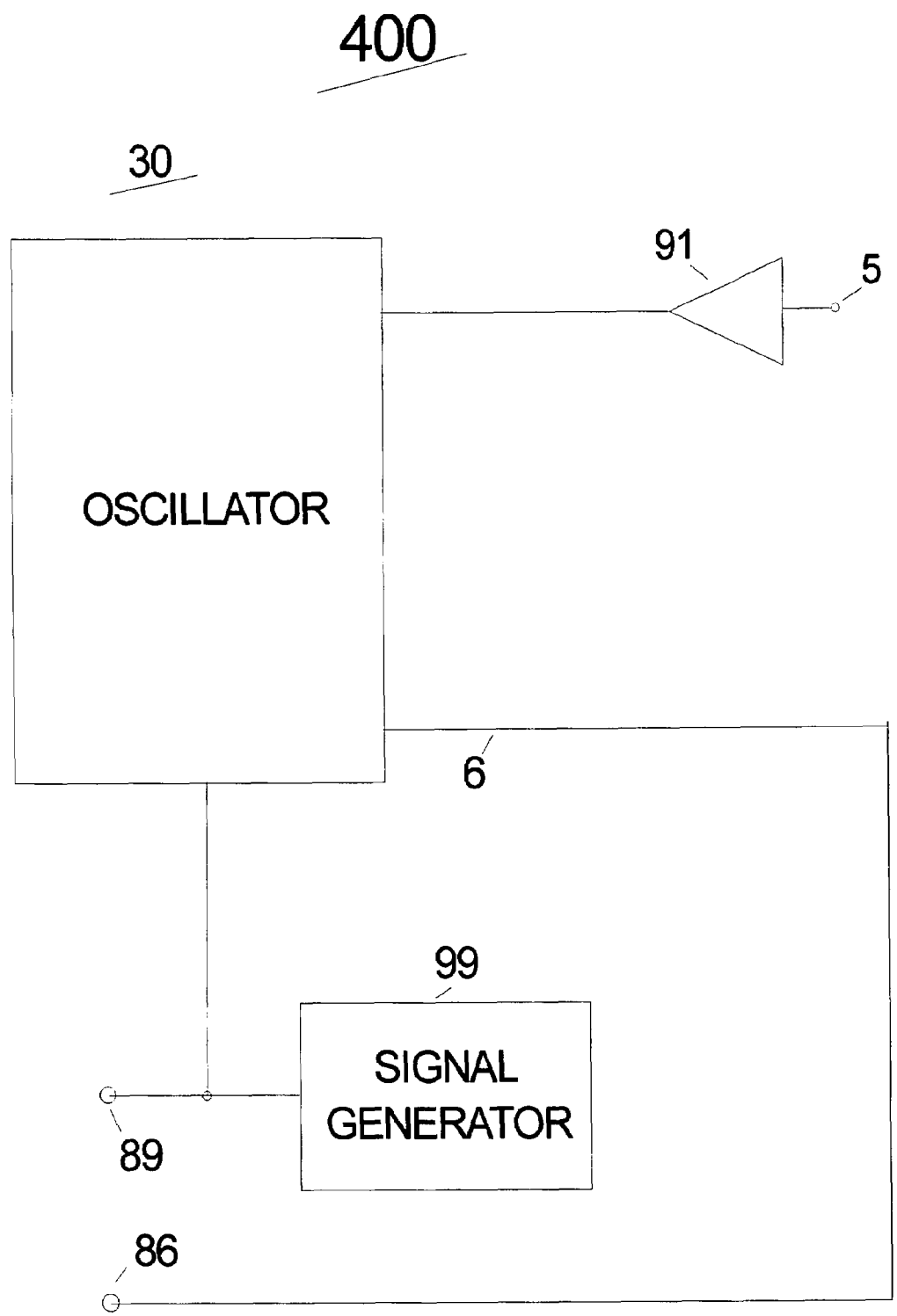
FIG. 20 shows a block diagram of analog to digital sensor measurement systems 400.

Referring now to FIG. 20, is analog to digital sensor measuring system 400 which provides a output, which maybe digital, representing the value of the signal level at input 5.

Transducers 91 output along with the output of signal generator 99, are connected to the gain control inputs of oscillator 30. The oscillator 30 output on line 6 connected to terminal 86 is the presence or absence of an AC signal. The signal generator 99 output is a time varying signal that is connected to a gain control input of oscillator 30 and terminal 89. The signal generator 99 output signal maybe a digital signal or can be converted to a digital signal to provide a digital output signal. Signal generator 99 continually recycles through it's full output range.

The output signal at terminal 86 changes when the oscillator 30 loop gain level increase above or decreases below the minimum loop gain value for oscillation to occur and be present on line 6. The level of oscillator 30 loop gain is a function of input 5 and also the signal generator 99 output signal value. Since the signal generator 99 output signal also controls the level of oscillator 30 loop gain, the signal generator 99 output signal value at terminal 89 indicates the signal level of input 5 when the change from presence to absence or vice a versa of an AC signal occurs at terminal 86.

Figure 21:
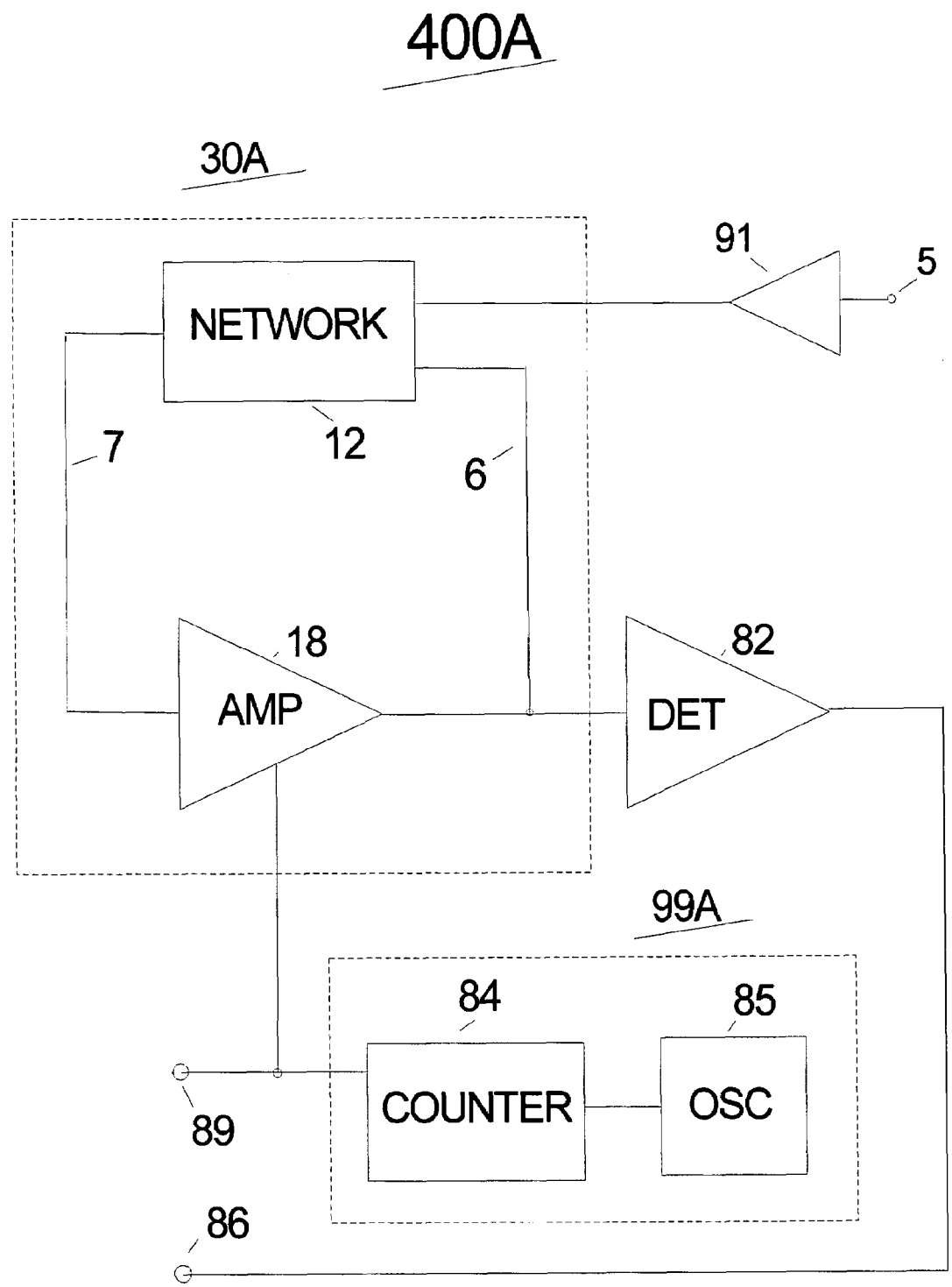
FIG. 21 shows a block diagram of analog to digital sensor measurement systems 400A.

Referring now to analog to digital sensor measuring system 400A in FIG. 21. Oscillator 30A consist of feedback network 12 and amplifier 18. Feedback network 12 is connected to the input and output of amplifier 18 by lines 6 and 7 so as to be capable of oscillating. Feedback network 12 also receives input signal from transducer 91 which receives input signal from input 5. The output of Amplifier 18 is also connected to detector 82 input. The output signal of detector 82 is connected to terminal 86. This output signal indicates the presence or absence of an AC signal on line 6. Signal generator 99A consist of oscillator 85 and counter 84. Oscillator 85 is an independent oscillator. The frequency of oscillator 85 is lower than that of the AC signal when present on line 6. Counter 84 counts the number of oscillator 85 output cycles. The output of counter 84 is a digital signal which is connected to the gain control input of amplifier 18 and terminal 89. The counter 84 output signal value determines the gain level of amplifier 18. Counter 84 after reaching it's maximum count resets to zero and starts counting again.

The detector 82 output signal at terminal 86 changes when the loop gain level increase above or decreases below the minimum loop gain value for oscillation to occur and be present on line 6. Since the counter 84 output signal controls the level of amplifier 18 gain, counter 84 output signal value at terminal 89 also represents the signal level of input 5 when the digital signal at terminal 86 changes state.

Although the above description has been directed to preferred embodiments of the invention, it will be understood and appreciated by those skilled in the art that other variations and modifications may be made without departing from the spirit and scope of the invention, and therefore the invention includes the full range of equivalents of the features and aspects set forth in the appended claims.

I claim:

1. A comparator system for providing a output signal level dependant on the comparison of a first to a second input signal level, comprising:
    first transducer means for providing first gain control output signal responsive to said first input signal level;
    second transducer means for providing second gain control output signal responsive to said second input signal level;
    oscillator means with loop gain level responsive to said first and second gain control output signals; and
    said oscillator means producing an AC output signal with said AC output signal level responsive to said loop gain level.

2. The invention of claim 1 wherein a detector means provides a output signal with said detector output signal level responsive to said AC output signal level.

3. The invention of claim 1 wherein said oscillator means loop gain is responsive to an additional third gain control output signal produced by signal generator means; and
    said third gain control output signal indicating ratio of said first to second input signal when said AC output signal level changes from zero to not zero or vice a versa.

4. The invention of claim 3 wherein a digital output means provides a digital output signal value responsive to said third gain control output signal.

5. The invention of claim 1 wherein a output signal is dependant on one input signal level compared to fixed value, comprising:
    said oscillator means loop gain being responsive to an additional third gain control output signal;
    said second transducer means comprises a fixed value component producing a constant second gain control output signal;
    signal generator means generating said third gain control output signal; and
    said third gain control output signal indicating input signal level when said AC output signal level changes from zero to not zero or vice a versa.

6. The invention of claim 5 wherein a digital output means provides a digital output signal value responsive to said third gain control output signal.

7. A sensor system providing an output signal level dependant on an input signal level having oscillator means producing an AC output signal, comprising:
    first transducer means producing first gain control output signal responsive to said AC output signal level;
    second transducer means producing second gain control output signal responsive to said input signal level;
    said oscillator means having loop gain level responsive to said first and second gain control output signals;
    the level of said AC output signal responsive to said loop gain level; and
    said AC output signal level increase causing decrease in said loop gain level so as to just maintain oscillation by keeping the loop gain level close to or at one with the said AC output signal level indicating the said input signal level.

8. The invention of claim 7 wherein a detector means provides a output signal indicating the said input signal level with said detector output signal level responsive to said AC output signal level.

9. A reference system producing a constant level output signal, comprising:
- oscillator means having loop gain level responsive to a gain control output signal;
- said oscillator means producing an AC output signal with said AC output signal level responsive to said loop gain level;
- transducer means producing said gain control output signal responsive to said AC output signal level; and
- said AC output signal level increase causing decrease in said loop gain level so as to just maintain oscillation with the said AC output signal providing a constant output signal level.

10. The invention of claim 9 wherein a detector means provides a output signal with said detector output signal level responsive to said AC output signal level.

* * * * *